United States Patent
Xu et al.

(10) Patent No.: US 9,472,453 B2
(45) Date of Patent: Oct. 18, 2016

(54) SYSTEMS AND METHODS OF FORMING A REDUCED CAPACITANCE DEVICE

(71) Applicant: QUALCOMM Incorporated, San Diego, CA (US)

(72) Inventors: Jeffrey Junhao Xu, San Diego, CA (US); John Jianhong Zhu, San Diego, CA (US); Stanley Seungchul Song, San Diego, CA (US); Kern Rim, San Diego, CA (US); Choh Fei Yeap, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 14/471,086

(22) Filed: Aug. 28, 2014

(65) Prior Publication Data
US 2015/0262875 A1    Sep. 17, 2015

Related U.S. Application Data

(60) Provisional application No. 61/952,384, filed on Mar. 13, 2014.

(51) Int. Cl.
*H01L 21/44* (2006.01)
*H01L 21/768* (2006.01)
*H01L 21/311* (2006.01)

(52) U.S. Cl.
CPC ... *H01L 21/76879* (2013.01); *H01L 21/31116* (2013.01); *H01L 21/31144* (2013.01); *H01L 21/7682* (2013.01); *H01L 21/76885* (2013.01)

(58) Field of Classification Search
CPC ............ H01L 21/31138; H01L 21/7682; H01L 21/76879; H01L 21/76885
See application file for complete search history.

(56) References Cited

U.S. PATENT DOCUMENTS 5,282,925 A    2/1994  Jeng et al.
5,980,770 A    11/1999 Ramachandran et al.
(Continued)

FOREIGN PATENT DOCUMENTS

JP    H07326670 A    12/1995
WO    2004053948 A2    6/2004

OTHER PUBLICATIONS

Yoo, H.J. et al., "Demonstration of a Reliable High-Performance and Yielding Air gap Interconnect Process," 2010 International Technology Conference (IITC), 2010, pp. 1-3.
(Continued)

*Primary Examiner* — Robert Bachner
(74) *Attorney, Agent, or Firm* — Toler Law Group, PC

(57) ABSTRACT

A method includes forming an electronic device structure including a substrate, an oxide layer, and a first low-k layer. The method also includes forming openings by patterning the oxide layer, filling the openings with a conductive material to form conductive structures within the openings, and removing the oxide layer using the first low-k layer as an etch stop layer. The conductive structures contact the first low-k layer. Removing the oxide layer includes performing a chemical vapor etch process with respect to the oxide layer to form an etch byproduct and removing the etch byproduct. The method includes forming a second low-k layer using a deposition process that causes the second low-k layer to define one or more cavities. Each cavity is defined between a first conductive structure and an adjacent conductive structure, the first and second conductive structures have a spacing therebetween that is smaller than a threshold distance.

28 Claims, 10 Drawing Sheets

(56) References Cited

U.S. PATENT DOCUMENTS

| | | |
|---|---|---|
| 6,074,951 A | 6/2000 | Kleinhenz et al. |
| 6,159,845 A | 12/2000 | Yew et al. |
| 6,162,739 A | 12/2000 | Sumnitsch et al. |
| 6,335,261 B1 | 1/2002 | Natzle et al. |
| 6,368,939 B1 | 4/2002 | Sasaki |
| 6,403,461 B1 | 6/2002 | Tae et al. |
| 6,656,824 B1 | 12/2003 | Hanafi et al. |
| 6,838,347 B1 | 1/2005 | Liu et al. |
| 6,858,532 B2 | 2/2005 | Natzle et al. |
| 6,951,821 B2 | 10/2005 | Hamelin et al. |
| 6,967,167 B2 | 11/2005 | Geiss et al. |
| 7,091,069 B2 | 8/2006 | Doris et al. |
| 7,589,014 B2 | 9/2009 | Shimooka et al. |
| 7,879,683 B2 | 2/2011 | Al-Bayati et al. |
| 8,252,194 B2 | 8/2012 | Kiehlbauch et al. |
| 8,404,561 B2 | 3/2013 | Lee et al. |
| 2006/0003577 A1 | 1/2006 | Sone |
| 2006/0051966 A1 | 3/2006 | Or et al. |
| 2006/0196527 A1 | 9/2006 | Nishimura et al. |
| 2007/0123051 A1 | 5/2007 | Arghavani et al. |
| 2008/0265426 A1 | 10/2008 | Seidel et al. |
| 2009/0093100 A1 | 4/2009 | Xia et al. |
| 2011/0053380 A1 | 3/2011 | Sapre et al. |
| 2012/0252206 A1 | 10/2012 | Naik et al. |

OTHER PUBLICATIONS

International Search Report and Written Opinion—PCT/US2015/014836—ISA/EPO—Jun. 19, 2015.

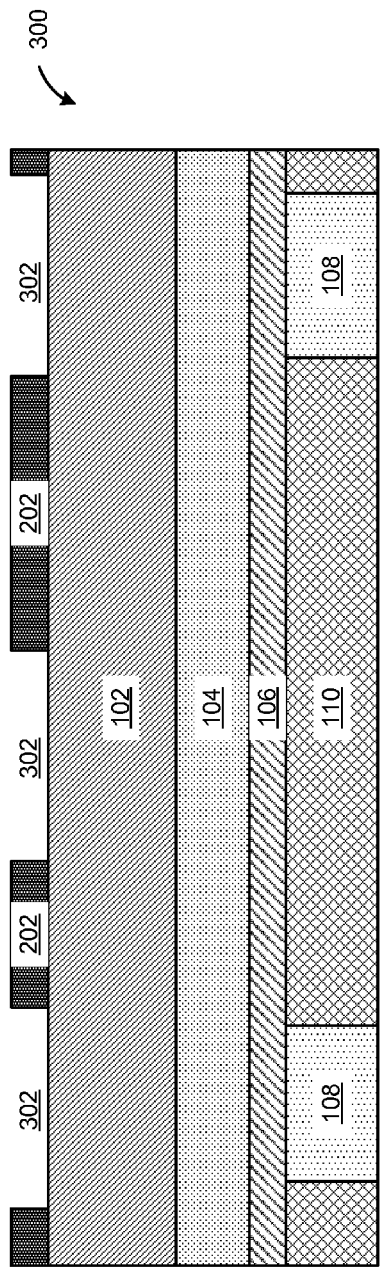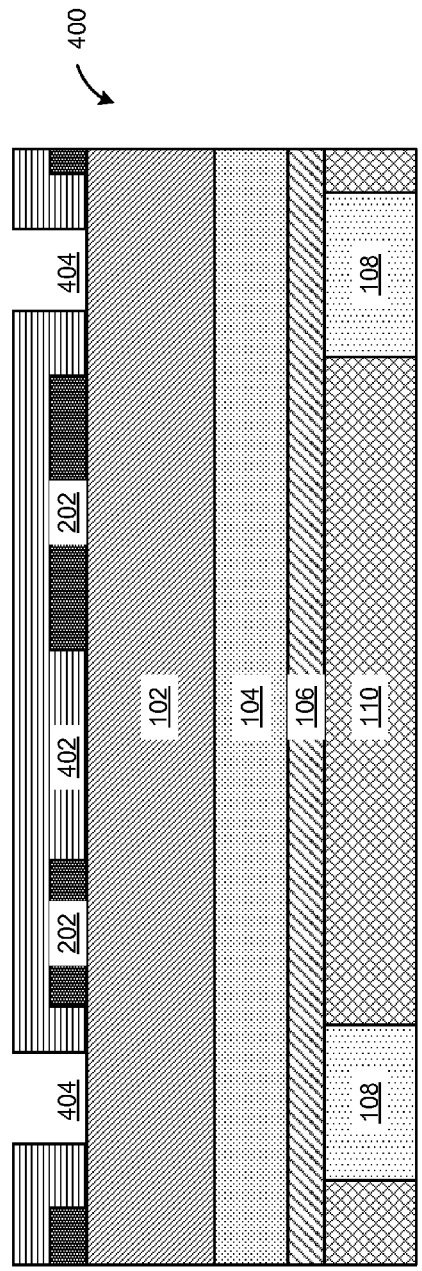

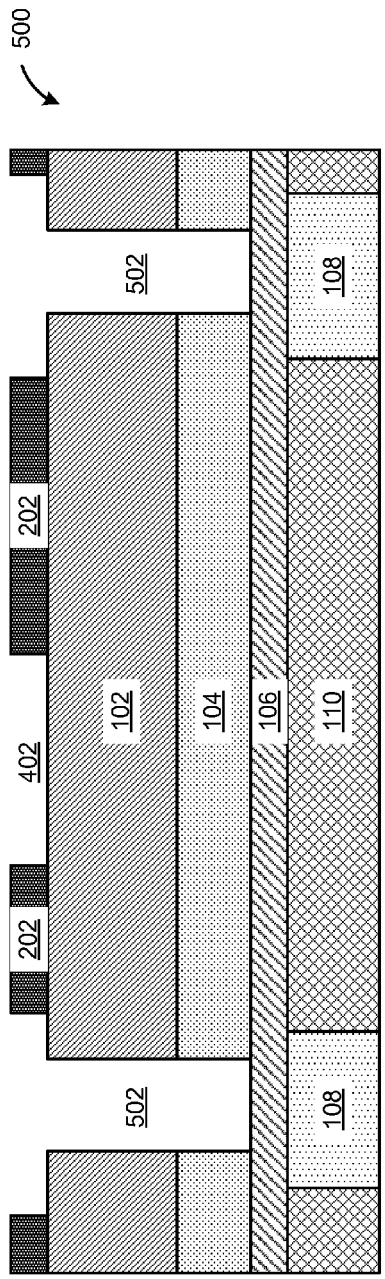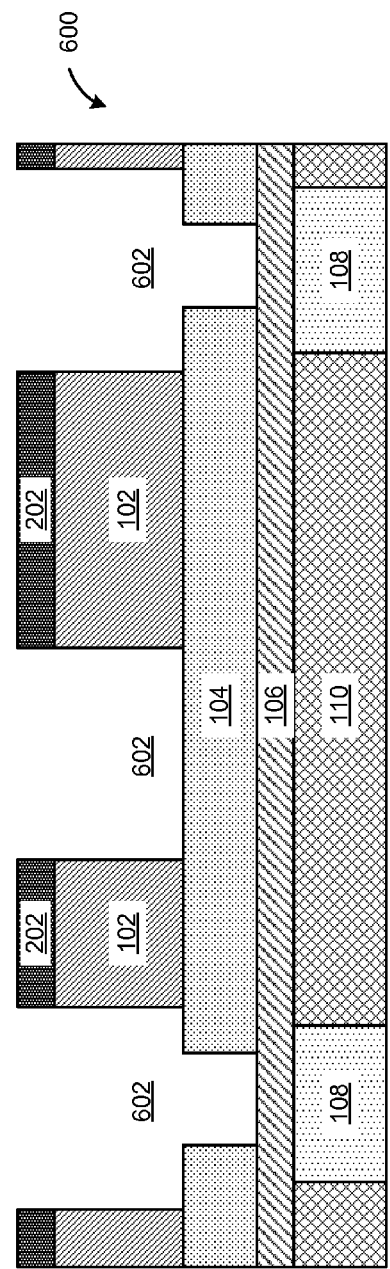

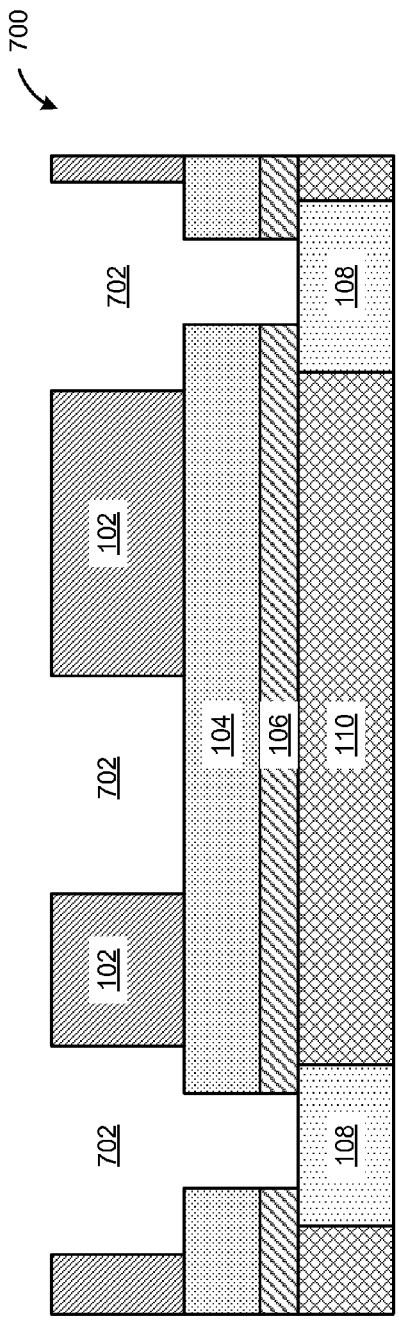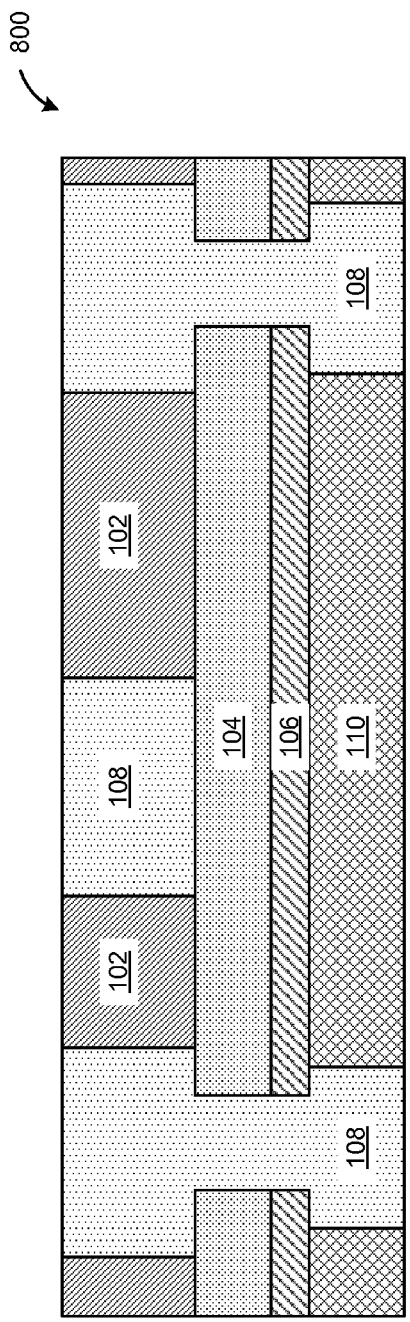

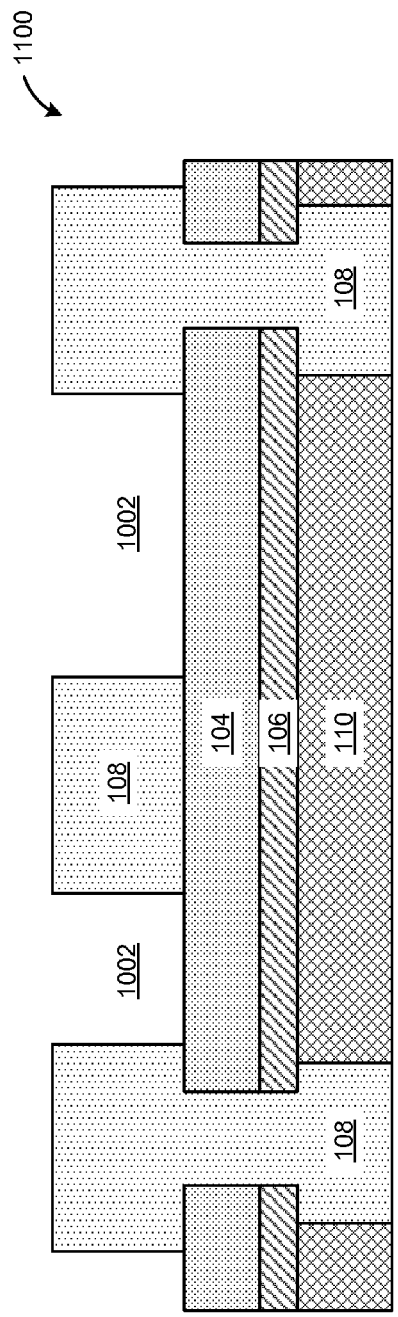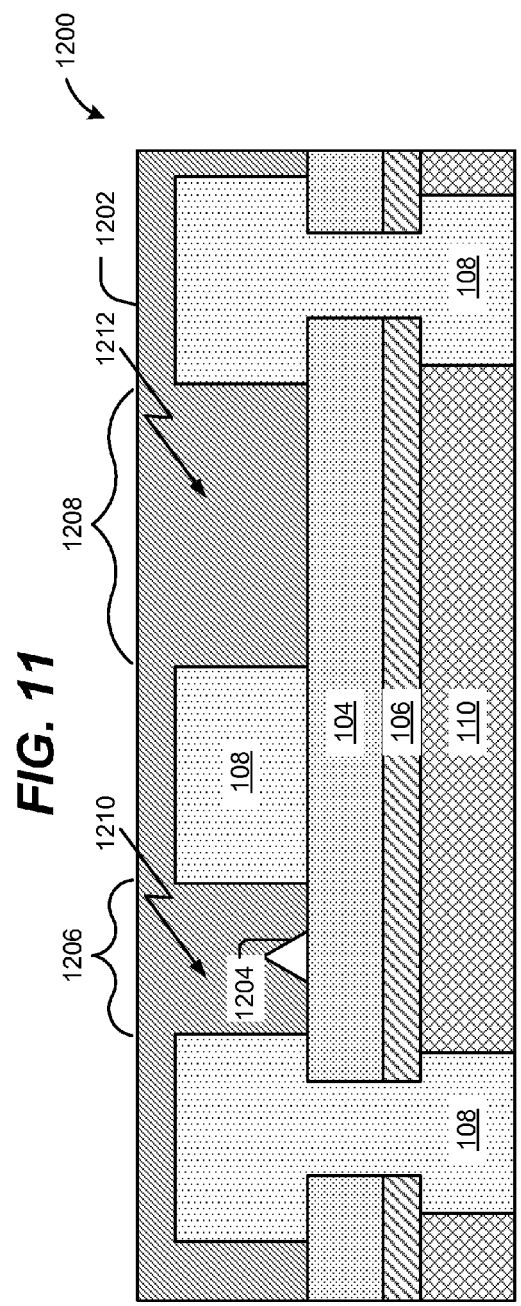

SYSTEMS AND METHODS OF FORMING A REDUCED CAPACITANCE DEVICE

I. CROSS-REFERENCE TO RELATED APPLICATIONS

The present application claims priority from commonly owned U.S. Provisional Patent Application No. 61/952,384 filed Mar. 13, 2014 and entitled "CAPACITANCE REDUCTION SYSTEM," the contents of which are expressly incorporated herein by reference in their entirety.

II. FIELD

The present disclosure is generally related to systems and methods of forming a reduced capacitance device.

III. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

To enable the computing capabilities, the computing devices include processors. As technology advances, these processors include more and more devices and the devices become smaller and smaller. Computing devices having a reduced feature size (e.g., including smaller conductive structures) may be smaller, more power efficient, more powerful, or a combination thereof. As such, imperfections (e.g., material contamination or structural damage) associated with conductive structures (e.g., wires) interconnecting devices have a larger relative effect on performance, as compared to imperfections associated with conductive structures having a larger feature size.

Additionally, resistive-capacitive (RC) delay may hinder propagation speed associated with transmitting signals using the conductive structures. The RC delay may have a greater effect on conductive structures that are located close together (e.g., 10 nanometers (nm) apart) as compared to conductive structures that are located farther apart. Reducing cross-capacitance associated with the conductive structures may reduce the RC delay. However, development of compounds (e.g., low-k dielectric structures) that reduce cross capacitance between adjacent conductive structures has not kept pace with device miniaturization processes.

IV. SUMMARY

In a particular embodiment, an electronic device is formed by a process that enables generation of conductive structures (e.g., interconnect wires) that have a lower level of contamination or damage than conductive structures fabricated using other processes. Conductive structures having a lower contamination level or damage level may conduct signals (e.g., signals between integrated circuit components) more efficiently. Further, fabrication of the conductive structures may facilitate fabricating a layer (e.g., a dielectric layer) that defines one or more cavities (e.g., air gaps) based on a distance between adjacent conductive structures. A layer that defines one or more cavities may have a non-uniform dielectric constant (e.g., the layer may have a lower dielectric constant at a location that defines a cavity as compared to another location where the layer does not define a cavity). A layer that has a non-uniform dielectric constant may decrease cross-coupling capacitance. Thus, a layer that defines one or more cavities based on a distance between adjacent conductive structures may decrease cross-coupling capacitance associated with conductive structures that are close together. Reducing the capacitance associated with the conductive structures may reduce delay (e.g., resistive-capacitive (RC) delay) and thereby improve performance and power characteristics associated with the conductive structures.

In a particular embodiment, a method includes forming an electronic device structure including a substrate, an oxide layer, and a first low-k layer. The method also includes forming multiple openings in the electronic device structure by patterning the oxide layer and filling the openings with a conductive material to form multiple conductive structures within the openings. The conductive structures contact the first low-k layer. The method further includes, after forming the conductive structures, removing the oxide layer using the first low-k layer as an etch stop layer. Removing the oxide layer includes performing a chemical vapor etch process with respect to the oxide layer to form an etch byproduct and removing the etch byproduct. The method also includes forming a second low-k layer after removing the oxide layer. The second low-k layer is formed using a deposition process that causes the second low-k layer to define one or more cavities. Each cavity of the one or more cavities is defined between a first conductive structure of the conductive structures and a second conductive structure of the conductive structures. The first conductive structure is adjacent to the second conductive structure. A spacing between the first conductive structure and the second conductive structure is smaller than a threshold distance.

In another particular embodiment, an apparatus includes an electronic device formed by a process that includes forming an electronic device structure that includes a substrate, an oxide layer, and a first low-k layer. The process also includes forming multiple openings in the electronic device structure by patterning the oxide layer and filling the openings with a conductive material to form multiple conductive structures within the openings. The conductive structures contact the first low-k layer. The process further includes, after forming the conductive structures, removing the oxide layer using the first low-k layer as an etch stop layer. Removing the oxide layer includes performing a chemical vapor etch process with respect to the oxide layer to form an etch byproduct and removing the etch byproduct. The process also includes forming a second low-k layer after removing the oxide layer. The second low-k layer is formed using a deposition process that causes the second low-k layer to define one or more cavities. Each cavity of the one or more cavities is defined between a first conductive structure of the conductive structures and a second conductive structure of the conductive structures. The first conductive structure is adjacent to the second conductive structure.

A spacing between the first conductive structure and the second conductive structure is smaller than a threshold distance.

In another particular embodiment, a computer-readable storage device stores instructions that, when executed by a processor, cause the processor to perform operations. The operations include forming an electronic device structure including a substrate, an oxide layer, and a first low-k layer. The operations also include forming multiple openings in the electronic device structure by patterning the oxide layer and filling the openings with a conductive material to form multiple conductive structures within the openings. The conductive structures contact the first low-k layer. The operations further include, after forming the conductive structures, removing the oxide layer using the first low-k layer as an etch stop layer. Removing the oxide layer includes performing a chemical vapor etch process with respect to the oxide layer to form an etch byproduct and removing the etch byproduct. The operations also include forming a second low-k layer after removing the oxide layer. The second low-k layer is formed using a deposition process that causes the second low-k layer to define one or more cavities. Each of the one or more cavities is defined between a first conductive structure of the conductive structures and a second conductive structure of the conductive structures. The first conductive structure is adjacent to the second conductive structure. A spacing between the first conductive structure and the second conductive structure is smaller than a threshold distance.

One particular advantage provided by at least one of the disclosed embodiments is that an electronic device formed by removing an oxide layer as described herein may include conductive structures (e.g., wires) that have a lower level of contamination or damage than conductive structures fabricated using other processes. Conductive structures having a lower contamination level or damage level may conduct signals (e.g., signals between integrated circuit components) more efficiently (e.g., more quickly and using less power). Further, fabrication of the conductive structures may facilitate fabricating a layer (e.g., a dielectric layer) that has a non-uniform dielectric constant. A layer that has a non-uniform dielectric constant may decrease a capacitance (e.g., cross-coupling capacitance) associated with conductive structures that are close together. Additionally, fabrication of the conductive structures as described may facilitate fabricating a pristine (or substantially pristine) dielectric layer. A pristine dielectric layer may have a lower dielectric constant, as compared to a dielectric layer that has been subjected to etch processing. A lower dielectric constant may reduce a capacitance associated with conductive structures interspersed with the pristine dielectric layer. Reducing the capacitance associated with the conductive structures may reduce delay (e.g., RC delay) and thereby improve performance and power characteristics associated with the conductive structures.

Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

FIG. 3 is a diagram showing a side view of a third illustrative embodiment of a structure during at least one stage in the process of fabricating an electronic device;

FIG. 4 is a diagram showing a side view of a fourth illustrative embodiment of a structure during at least one stage in the process of fabricating an electronic device;

FIG. 5 is a diagram showing a side view of a fifth illustrative embodiment of a structure during at least one stage in the process of fabricating an electronic device;

FIG. 6 is a diagram showing a side view of a sixth illustrative embodiment of a structure during at least one stage in the process of fabricating an electronic device;

FIG. 7 is a diagram showing a side view of a seventh illustrative embodiment of a structure during at least one stage in the process of fabricating an electronic device;

FIG. 8 is a diagram showing a side view of an eighth illustrative embodiment of a structure during at least one stage in the process of fabricating an electronic device;

FIG. 11 is a diagram showing a side view of an eleventh illustrative embodiment of a structure during at least one stage in the process of fabricating an electronic device;

FIG. 12 is a diagram showing a side view of a twelfth illustrative embodiment of a structure during at least one stage in the process of fabricating an electronic device;

VI. DETAILED DESCRIPTION

FIGS. 1-13, as described herein, illustrate a side view of a structure as formed during particular stages of one or more methods of fabricating one or more electronic devices. In a particular embodiment, each structure illustrated in FIGS. 1-13 is formed during particular stages of fabricating an electronic device (e.g., a semiconductor device). A method of fabricating one or more of the structures illustrated in FIGS. 1-13 may correspond to a back end of line (BEOL) process (e.g., forming interconnects between components such as capacitors, inductors, transistors, diodes, resistors, or other integrated circuit devices). Accordingly, other processes may also be performed that are not specifically described, such as front end of line (FEOL) processes (e.g., forming components), packaging, or other BEOL processes. One or more of the structures illustrated in FIGS. 1-13 may correspond to a semiconductor device, a passive-on-glass device, an integrated circuit device, or another electronic device.

Figure 1:
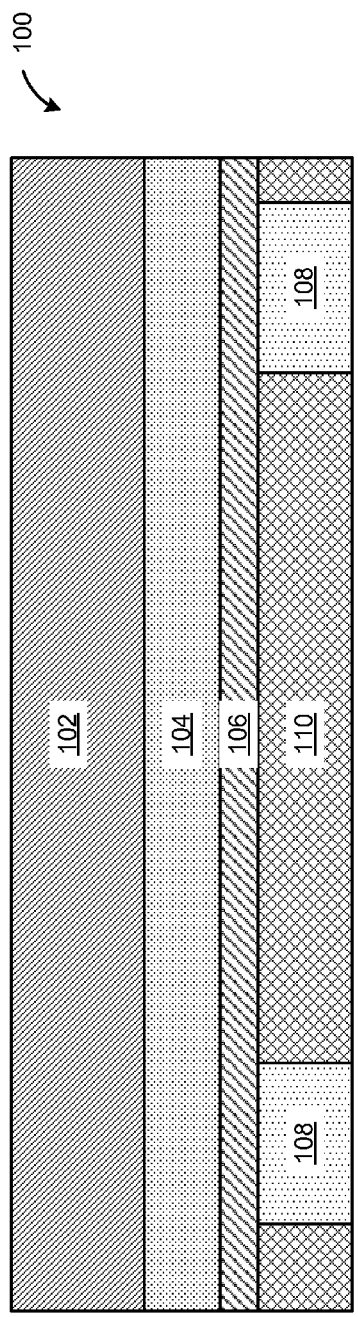
FIG. 1 is a diagram showing a side view of a first illustrative embodiment of a structure during at least one stage in a process of fabricating an electronic device.

Referring to FIG. 1, a first illustrative diagram of a side view of a structure as formed during at least one stage in a process of fabricating an electronic device is depicted and generally designated 100. The structure 100 may correspond to an electronic device structure that includes a substrate, an oxide layer 102, and a low-k layer (e.g., a first low-k layer 104 or a second low-k layer 110). FIG. 1 shows the oxide layer 102 deposited above the first low-k layer 104. The first low-k layer 104 is deposited above an etch stop layer 106 (e.g., a barrier layer). The etch stop layer 106 is deposited above the second low-k layer 110. The second low-k layer 110 may be interspersed with one or more conductive structures 108. In a particular embodiment, the oxide layer 102, the first low-k layer 104, the etch stop layer 106, the second low-k layer 110, or a combination thereof, comprise a substrate. In another particular embodiment, the second low-k layer 110 and the one or more conductive structures 108 are deposited above a substrate.

The first low-k layer 104 may be formed from the same material as the second low-k layer 110 or from a different material than the second low-k layer 110. The oxide layer 102 may have a higher dielectric constant than the first low-k layer 104. For example, the oxide layer 102 may be formed from silicon dioxide ($SiO_2$) and the first low-k layer 104 may be formed from a low-k dielectric material (e.g., carbon doped dielectrics that include silicon, carbon, oxygen, and hydrogen (SiCOH)). Each of the one or more conductive structures 108 may include copper, tungsten, silver, gold, an alloy of copper, tungsten, silver, or gold, or a combination thereof. Each conductive structure of the one or more conductive structures 108 may be formed from the same material or different materials.

In a particular embodiment, FIGS. 2-7 illustrate a side view of a structure formed using a dual damascene etch and clean process. The dual damascene etch and clean process may form one or more openings in the structure 100 of FIG. 1.

Figure 2:
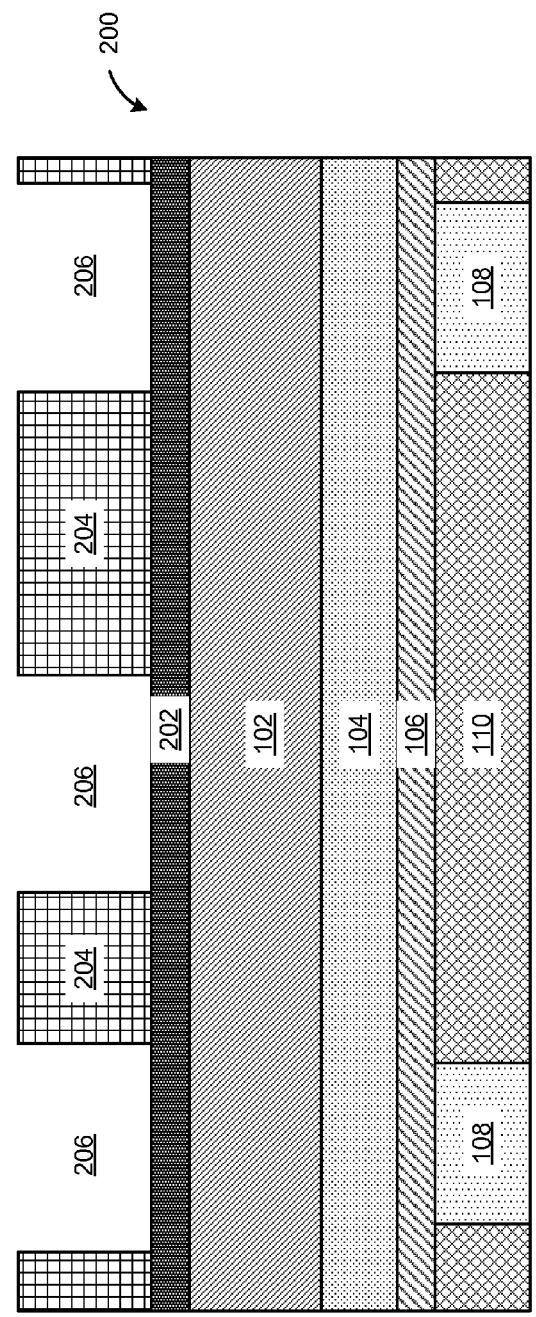
FIG. 2 is a diagram showing a side view of a second illustrative embodiment of a structure during at least one stage in the process of fabricating an electronic device.

Referring to FIG. 2, a second illustrative diagram of a side view of a structure as formed during at least one stage in the process of fabricating an electronic device is depicted and generally designated 200. In FIG. 2, after the structure 100 of FIG. 1 is formed (e.g., after the oxide layer 102 is deposited above the first low-k layer 104), a hard metal mask is deposited over the oxide layer 102. For example, a metal (e.g., Titanium Nitride (TiN)) layer 202 is deposited above the oxide layer 102. A mask 204 (e.g., a photoresist) is applied to the metal layer 202. The mask 204 may be interspersed with gaps 206. For example, the mask 204 may be patterned by selectively exposing the mask 204 to radiation and developing the mask 204 with a developer to remove either the exposed or unexposed portions of the mask 204. In a particular embodiment, locations of the gaps 206 correspond to locations of the one or more conductive structures 108.

Referring to FIG. 3, a third illustrative diagram of a side view of a structure as formed during at least one stage in the process of fabricating an electronic device is depicted and generally designated 300. In FIG. 3, after the structure 200 of FIG. 2 is formed (e.g., after the mask 204 is applied to the metal layer 202), an etch process is performed to form one or more openings 302 in the metal layer 202. For example, the metal layer 202 may be patterned with the mask 204 to form one or more openings 302 in the metal layer 202. For example, using the mask 204 as an etch mask, a reactive ion etch (RIE) may be used to expose portions of the oxide layer 102. To illustrate, the RIE may be used to pattern the metal layer 202. After the metal layer 202 is patterned, the mask 204 is removed.

Referring to FIG. 4, a fourth illustrative diagram of a side view of a structure as formed during at least one stage in the process of fabricating an electronic device is depicted and generally designated 400. In FIG. 4, after the structure 300 of FIG. 3 is formed (e.g., after the mask 204 is removed), a non-conductive material 402 (e.g., a photoresist) is applied to the metal layer 202. The one or more openings 302 are filled with the non-conductive material 402. One or more vias 404 are formed in the non-conductive material 402. For example, portions of the non-conductive material 402 may be removed by dry etching to expose portions of the oxide layer 102. In a particular embodiment, locations of the vias 404 may correspond to locations of the one or more conductive structures 108.

Referring to FIG. 5, a fifth illustrative diagram of a side view of a structure as formed during at least one stage in the process of fabricating an electronic device is depicted and generally designated 500. In FIG. 5, after the structure 400 of FIG. 4 is formed (e.g., after the vias 404 are formed), an etch process is performed to form one or more openings 502 in the oxide layer 102 and in the first low-k layer 104. For example, a damascene (e.g., chemical) etch process may be performed to form the one or more openings 502 in the oxide layer 102 and in the first low-k layer 104. The chemical etch process may be selective to the etch stop layer 106 so that the etch stop layer 106 is not removed.

Referring to FIG. 6, a sixth illustrative diagram of a side view of a structure as formed during at least one stage in the process of fabricating an electronic device is depicted and generally designated 600. In FIG. 6, after the structure 500 of FIG. 5 is formed (e.g., after the one or more openings 502 are formed), an etch process is performed to form one or more openings 602 in the oxide layer 102. For example, the metal layer 202 may be used as an etch mask to etch the oxide layer 102. In a particular embodiment, locations of the openings 602 may correspond to locations of the one or more conductive structures 108.

Referring to FIG. 7, a seventh illustrative diagram of a side view of a structure as formed during at least one stage in the process of fabricating an electronic device is depicted and generally designated 700. In FIG. 7, after the structure 600 of FIG. 6 is formed (e.g., after the openings 602 are formed), an etch process is performed to form one or more openings 702 in the etch stop layer 106. For example, an etch process (e.g., chemical etching, dry etching, or chemical-mechanical etching) may be performed to remove the metal layer 202. A same or different etch process may be performed to remove the etch stop layer 106. For example, the metal layer 202 may be removed using dry etching and the etch stop layer 106 may be removed using chemical etching. In a particular embodiment, locations of the openings 702 may correspond to locations of the one or more conductive structures 108.

Referring to FIG. 8, an eighth illustrative diagram of a side view of a structure as formed during at least one stage in the process of fabricating an electronic device is depicted and generally designated 800. In FIG. 8, after the structure 700 of FIG. 7 is formed (e.g., after the one or more openings 702 are formed), the one or more openings 702 may be filled with a conductive material to form additional conductive structures 108 within the one or more openings 702. Additionally or in the alternative, the conductive material may contact previously formed conductive structures of the one or more conductive structures 108. In a particular embodiment, the one or more openings 702 may be filled with the conductive material using a dual damascene deposition (e.g., gap-fill) process and using a chemical-mechanical planarization metallization process. After the one or more openings 702 are filled with the conductive material, each conductive structure of the one or more conductive structures 108 may contact the first low-k layer 104 and the oxide layer 102. In a particular embodiment, the conductive material may include copper, tungsten, silver, gold, an alloy of copper, tungsten, silver, or gold, or a combination thereof. Each of the one or more openings 702 may be filled using the same conductive material or different conductive materials.

Figure 9:
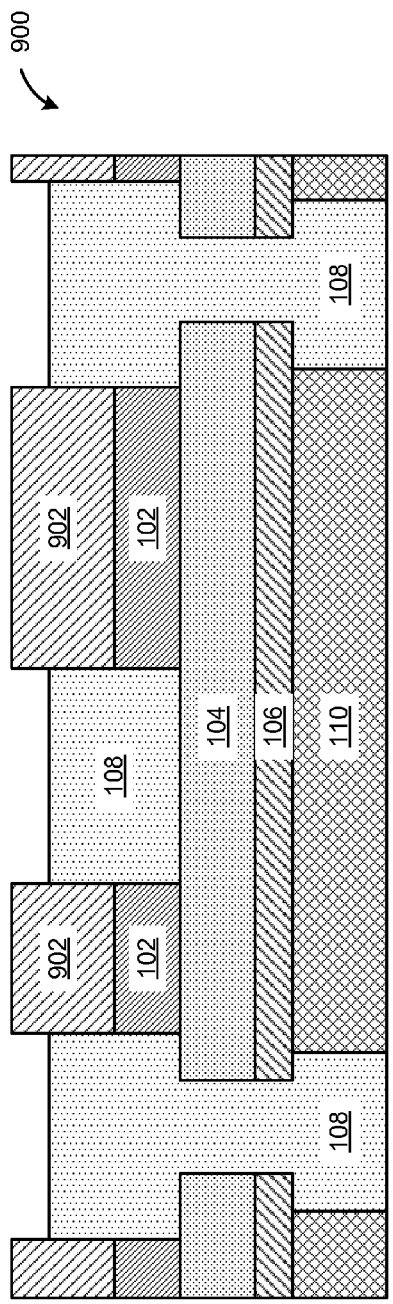
FIG. 9 is a diagram showing a side view of a ninth illustrative embodiment of a structure during at least one stage in the process of fabricating an electronic device.

Referring to FIG. 9, a ninth illustrative diagram of a side view of a structure as formed during at least one stage in the process of fabricating an electronic device is depicted and generally designated 900. In FIG. 9, after the one or more openings 702 are filled with the conductive material, a chemical vapor etch process is performed. The chemical vapor etch process may use a chemical vapor that includes ammonium ($NH_4$) and hydrogen fluoride (HF), ammonium and nitrogen trifluoride ($NF_3$), or a combination thereof. The chemical vapor used in the chemical vapor etch process may react with a portion of the oxide layer 102 to form an etch byproduct 902. At least a portion of the chemical vapor may be consumed to form the etch byproduct 902. The chemical vapor etch process may be self-limiting. For example, the chemical vapor etch process may be self-limiting because the etch byproduct 902 forms a barrier layer over a remaining portion of the oxide layer 102, preventing the chemical vapor from reacting with the remaining portion of the oxide layer 102. As another example, the chemical vapor etch process may be self-limiting because the chemical vapor does not react with the first low-k layer 104. As another example, the chemical vapor etch process may be self-limiting because the chemical vapor is completely consumed by reacting with the portion of the oxide layer 102 (e.g., the chemical vapor etch process may be stoichiometrically self-limiting). The chemical vapor etch process may be nonreactive with materials of the one or more conductive structures 108. Thus, in a particular embodiment, the one or more conductive structures 108 are not rounded or otherwise etched due to the chemical vapor etch process.

Figure 10:
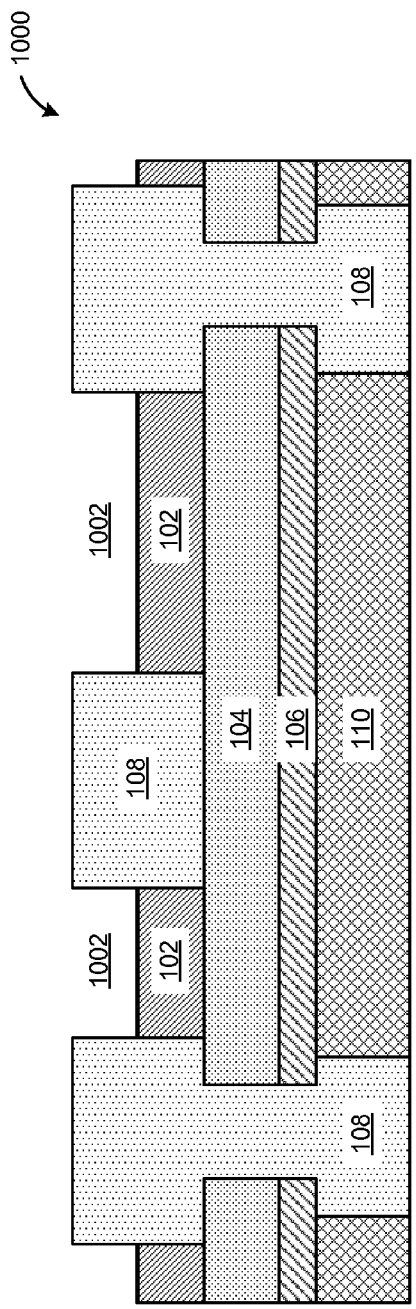
FIG. 10 is a diagram showing a side view of a tenth illustrative embodiment of a structure during at least one stage in the process of fabricating an electronic device.

Referring to FIG. 10, a tenth illustrative diagram of a side view of a structure as formed during at least one stage in the process of fabricating an electronic device is depicted and generally designated 1000. In FIG. 10, after the chemical vapor etch process is performed, the etch byproduct 902 of FIG. 9 is removed to form one or more openings 1002. The etch byproduct 902 of FIG. 9 may be removed using an in-situ baking process. For example, the structure 900 of FIG. 9 may be heated to a temperature between 120 degrees Celsius (° C.) and 200° C. to vaporize the etch byproduct 902.

Referring to FIG. 11, an eleventh illustrative diagram of a side view of a structure as formed during at least one stage in the process of fabricating an electronic device is depicted and generally designated 1100. In FIG. 11, after the etch byproduct 902 of FIG. 9 is removed, additional chemical vapor etch processes (e.g., similar to the chemical vapor etch process described with reference to FIG. 9) and etch byproduct removal processes (e.g., similar to the etch byproduct removal process described with reference to FIG. 10) may be iteratively performed to enlarge the one or more openings 1002 until a portion of the first low-k layer 104 is exposed. Alternatively, the first low-k layer 104 may be exposed after a single chemical vapor etch process and a single etch byproduct removal process.

An electronic device formed by removing an oxide layer as described with reference to FIGS. 9-11 may include conductive structures (e.g., the one or more conductive structures 108) that have a lower level of contamination or damage than conductive structures fabricated using other processes (e.g., a process where an oxide layer used to form openings is removed using an etchant that is reactive with a material of the conductive structures). Conductive structures having a lower contamination level or damage level may conduct signals (e.g., signals between components such as capacitors, transistors, diodes, inductors, resistors, or other integrated circuit components) more efficiently (e.g., more quickly and using less power). Conductive structures having a lower contamination or damage level may have better reliability performance, such as better electromigration performance. Further, fabrication of the conductive structures as described may facilitate fabricating a layer (e.g., a dielectric layer) that has a non-uniform dielectric constant, as described herein. Additionally, fabrication of the conductive structures as described may facilitate fabricating a pristine (or substantially pristine) dielectric layer (e.g., a dielectric layer that has not been subjected to etch processing), as described herein. Fabricating the layer that has the non-uniform dielectric constant may be performed in addition to fabricating the pristine dielectric layer or may be performed without fabricating the pristine dielectric layer. Fabricating the pristine dielectric layer may be performed without fabricating the layer that has the non-uniform dielectric constant. Further, an electronic device may include the conductive structures without including the pristine dielectric layer or the layer that has a non-uniform dielectric constant.

Referring to FIG. 12, a twelfth illustrative diagram of a side view of a structure as formed during at least one stage in the process of fabricating an electronic device is depicted and generally designated 1200. In FIG. 12, after the portion of the first low-k layer 104 is exposed, a third low-k layer 1202 is deposited above the first low-k layer 104 and above the one or more conductive structures 108. The third low-k layer 1202 may include a low-k dielectric (e.g., a dielectric material having a dielectric constant lower than silicon dioxide ($SiO_2$)). The third low-k layer 1202 may be formed from the same material as the first low-k layer 104, the second low-k layer 110, or both. The third low-k layer 1202 may be formed from a different material than the first low-k layer 104, from a different material than the second low-k layer 110, or both. In a particular embodiment, no liner may be formed between the third low-k layer 1202 and the one or more conductive structures 108. For example, the third low-k layer 1202 may be deposited directly on the one or more conductive structures 108 without depositing a liner layer of additional materials between the one or more conductive structures 108 and the third low-k layer 1202. In a particular embodiment, the third low-k layer 1202 may define one or more cavities (e.g., a cavity 1204). In another particular embodiment, the third low-k layer 1202 may not define a cavity.

A deposition process used to form the third low-k layer 1202 may generate differences in a dielectric constant of the third low-k layer 1202 based on distances between the one or more conductive structures 108. For example, the third low-k layer 1202 may be deposited using a chemical vapor deposition process that substantially fills gaps that are wider than a threshold distance and that partially fills gaps that are narrower than the threshold distance (e.g., due to limitations in chemical vapor deposition tools and processes). In FIG. 12, a first gap 1210 has a first distance 1206 between adjacent conductive structures and a second gap 1212 has a second distance 1208 between adjacent conductive structures. The first distance 1206 may be smaller than the threshold distance and the second distance 1208 may be greater than the threshold distance. Thus, the chemical vapor deposition process may form the third low-k layer 1202 in the first gap 1210 such that the third low-k layer 1202 defines one or more cavities (e.g., a cavity 1204) in the first gap 1210 and may form the third low-k layer 1202 in the second gap 1212 such that the second gap 1212 is substantially filled (e.g., the third low-k layer 1202 does not define any voids or cavities in the second gap 1212).

The one or more cavities may be formed in the presence of air or one or more other process gasses or gaseous byproducts of processing (e.g., nitrogen or argon). Thus, the one or more cavities may include one or more air gaps or gaps filled with the one or more other process gasses or gaseous byproducts of processing. A portion of the third low-k layer 1202 (e.g., at the first gap 1210) which defines one or more cavities may have a lower dielectric constant (e.g., due to the presence of the one or more cavities) than a portion of the third low-k layer 1202 (e.g., at the second gap 1212) which does not define one or more cavities. Thus, the dielectric constant of the third low-k layer 1202 may be non-uniform (e.g., the third low-k layer 1202 may have a lower dielectric constant at the first gap 1210 as compared to the second gap 1212) based on a distance between adjacent conductive structures. In a particular embodiment, a first average dielectric constant of the first low-k layer 104 may be larger than a second average dielectric constant of the third low-k layer 1202. A reduced dielectric constant (e.g., due to the presence of the one or more cavities) may reduce an effective capacitance between a pair of adjacent conductive structures. A reduced capacitance may reduce delay (e.g., resistive-capacitive (RC) delay) and thereby improve performance and power characteristics associated with the pair of adjacent conductive structures that have one or more cavities therebetween.

For example, a chemical vapor deposition process may be selected such that the chemical vapor deposition process fills gaps having a length of 30 nanometers (nm) or larger. The chemical vapor deposition process may be selected based on a distance between at least one pair of adjacent conductive structures of the electronic device. In this example, the first distance 1206 may be 20 nm (e.g., smaller than the threshold distance), and the second distance 1208 may be 45 nm (e.g., greater than or equal to the threshold distance). Thus, in this example, the selected chemical vapor deposition process may form the third low-k layer 1202 in a manner that defines the cavity 1204 in the first gap 1210 and may not define a cavity in the second gap 1212. Thus, a portion of the third low-k layer 1202 corresponding to the first gap 1210 may have a lower dielectric constant (e.g., due to the presence of the cavity 1204) than a portion of the third low-k layer 1202 corresponding to the second gap 1212. Thus, a dielectric constant of the third low-k layer 1202 may be non-uniform based on a distance between adjacent conductive structures of the one or more conductive structures 108.

Figure 13:
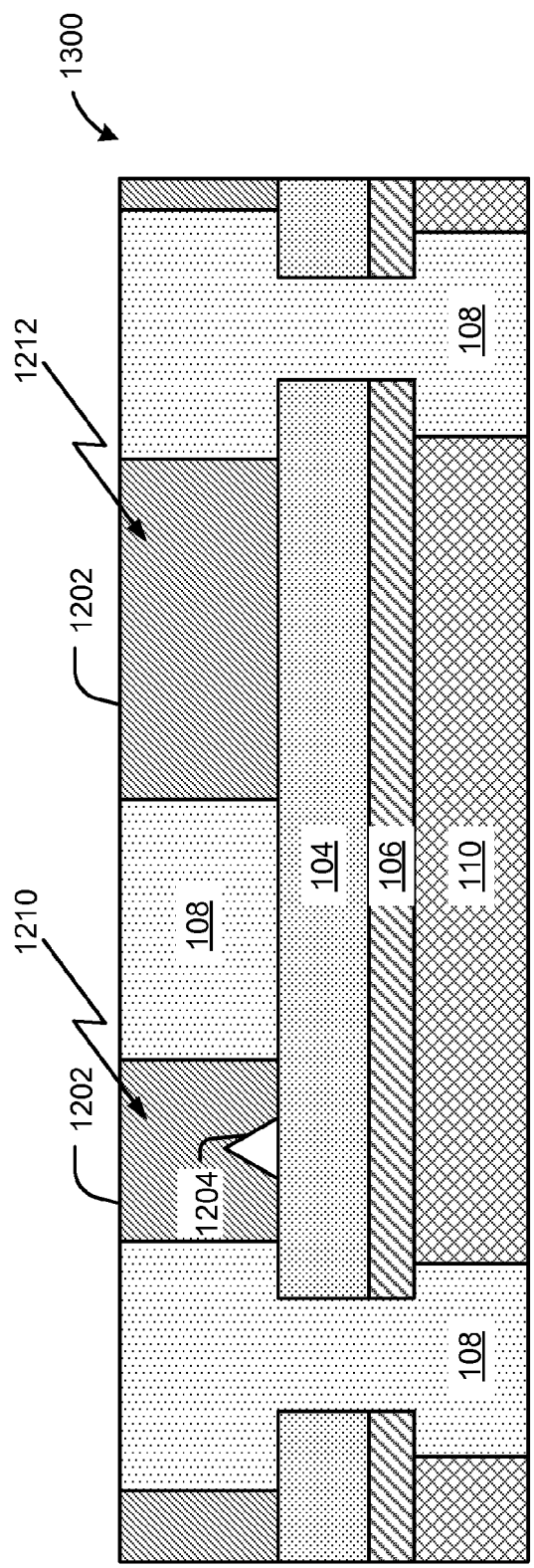
FIG. 13 is a diagram showing a side view of an thirteenth illustrative embodiment of a structure during at least one stage in the process of fabricating an electronic device.

Referring to FIG. 13, a thirteenth illustrative diagram of a side view of a structure as formed during at least one stage in the process of fabricating an electronic device is depicted and generally designated 1300. In FIG. 13, after the third low-k layer 1202 is formed, additional processing may be performed on the structure 1200 of FIG. 12 to expose the one or more conductive structures 108. In a particular embodiment, the additional processing includes a planarization process. For example, a chemical-mechanical planarization process may be performed to reduce the third low-k layer 1202 and to expose the one or more conductive structures 108. In a particular embodiment, the additional processing does not include etch processing using an etchant that is reactive with the one or more conductive structures 108, does not include etch processing using an etchant that is reactive with the third low-k layer 1202, or both. Thus, the one or more conductive structures 108 and the third low-k layer 1202 may not be rounded due to etch processing. For example, the third low-k layer 1202 may be a pristine dielectric layer (e.g., a dielectric layer that has not been subjected to etch processing). The third low-k layer 1202 may have a lower dielectric constant, as compared to a dielectric layer that has been subjected to etch processing. A lower dielectric constant may reduce a capacitance associated with the one or more conductive structures 108 (e.g., conductive structures interspersed with the third low-k layer 1202). Reducing the capacitance associated with the one or more conductive structures 108 may reduce delay (e.g., resistive-capacitive (RC) delay) and thereby improve performance and power characteristics associated with the one or more conductive structures 108.

An electronic device that includes a layer (e.g., the third low-k layer 1202) that has a non-uniform dielectric constant may have a reduced capacitance (e.g., cross-coupling capacitance) associated with conductive structures (e.g., interconnect wires) that are close together. Additionally, an electronic device that includes a pristine dielectric layer may have a reduced capacitance associated with conductive structures interspersed with the pristine dielectric layer, as compared to conductive structures interspersed with a dielectric layer that has been subjected to etch processing. Reducing the capacitance associated with the conductive structures may reduce delay (e.g., RC delay) and thereby improve performance and power characteristics associated with the conductive structures. The electronic device may include components such as transistors, capacitors, inductors, resistors, diodes, other integrated circuit devices, or a combination thereof, that are electrically coupled using the conductive structures. A layer (e.g., a layer having a non-uniform dielectric constant, a pristine dielectric layer, or both) that reduces a capacitance associated with conductive structures may further be used to improve dielectric breakdown performance. For example, the conductive structures may correspond to interconnect wires that connect two or more components of the electronic device.

Figure 14:
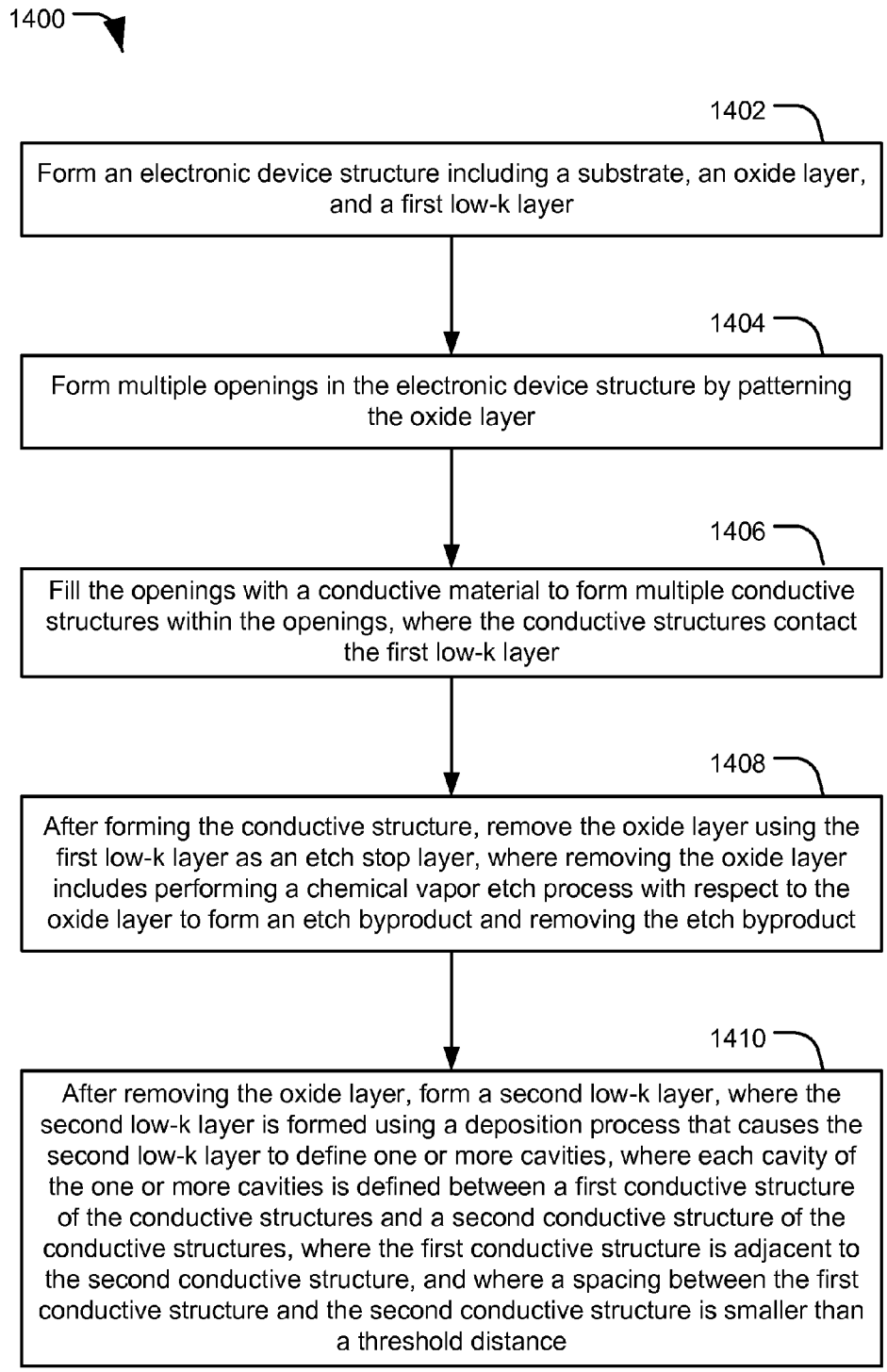
FIG. 14 is a flow chart that illustrates a method of forming an electronic device structure.

FIG. 14 is a flowchart illustrating a particular embodiment of a method 1400 of forming an electronic device. The method includes, at 1402, forming an electronic device structure including a substrate, an oxide layer, and a first low-k layer. For example, the electronic device structure may correspond to the structure 100 of FIG. 1, and the electronic device structure may include a substrate (e.g., a substrate that includes the etch stop layer 106 of FIG. 1), the oxide layer 102 of FIG. 1, and the first low-k layer 104 of FIG. 1.

The method 1400 also includes, at 1404, forming multiple openings in the electronic device structure by patterning the oxide layer. To illustrate, the one or more openings 702 of FIG. 7 may be formed in the electronic device structure by patterning (e.g., etching or otherwise selectively removing portions of) the oxide layer 102, the first low-k layer 104, the etch stop layer 106, or a combination thereof.

The method 1400 further includes, at 1406, filling the openings with a conductive material to form multiple conductive structures within the openings. The conductive structures may contact the first low-k layer. For example, the conductive material may fill the one or more openings 702 to form the one or more conductive structures 108 of FIG. 8. The one or more conductive structures 108 may contact the first low-k layer 104.

The method 1400 also includes, at 1408, after forming the conductive structures, removing the oxide layer using the first low-k layer as an etch stop layer. Removing the oxide layer includes performing a chemical vapor etch process with respect to the oxide layer to form an etch byproduct and removing the etch byproduct. For example, after the one or more conductive structures 108 are formed, the oxide layer 102 may be removed, as illustrated in FIGS. 9-11. Removing the oxide layer 102 may include performing a chemical vapor etch process using an etchant (e.g., a chemical vapor) that reacts with a portion of the oxide layer 102 to form the etch byproduct 902 of FIG. 9. Removing the oxide layer 102 may further include removing the etch byproduct 902 (e.g., by subjecting the etch byproduct 902 to elevated temperatures), as described with reference to FIG. 10. The oxide layer 102 may be removed by performing the chemical vapor etch process once and by removing the etch byproduct 902 once (e.g., the chemical vapor etch process reacts all of the oxide layer 102 to form the etch byproduct 902), or the oxide layer 102 may be removed by performing the chemical vapor etch process and by removing the etch byproduct 902 iteratively (e.g., the chemical vapor etch process and removal of the etch byproduct are performed multiple times).

The method 1400 further includes, at 1410, forming a second low-k layer after removing the oxide layer. The second low-k layer may be formed using a deposition process that causes the second low-k layer to define one or more cavities. Each cavity of the one or more cavities may be defined between a first conductive structure of the conductive structures and a second conductive structure of the conductive structures. The first conductive structure may be adjacent to the second conductive structure. A spacing between the first conductive structure and the second conductive structure may be smaller than a threshold distance. For example, after the oxide layer 102 is removed, the third low-k layer 1202 may be formed, as described with reference to FIG. 12. The third low-k layer 1202 may define one or more cavities (e.g., the cavity 1204). For example, the cavity 1204 may be defined in the first gap 1210 between adjacent conductive structures of the one or more conductive structures 108. The first distance 1206 of the first gap 1210 may be smaller than a threshold distance. A dielectric constant of the third low-k layer 1202 may be non-uniform (e.g., due to the presence of one or more cavities within the third low-k layer 1202) based on a distance between the adjacent conductive structures of the one or more conductive structures 108.

After forming the third low-k layer 1202, additional processing could be performed. The additional processing may include using a planarization process to expose the one or more conductive structures 108. The additional processing does not include etch processing using an etchant that is reactive with the one or more conductive structures 108, does not include etch processing using an etchant that is reactive with the third low-k layer 1202, or both. The third low-k layer 1202 may be a pristine low-k layer (e.g., a low-k layer that has not been subjected to etch processing).

The method 1400 of FIG. 14 may be initiated and/or performed by a processing unit, such as a central processing unit (CPU), a field-programmable gate array (FPGA) device, an application-specific integrated circuit (ASIC), a controller, another hardware device, firmware device, or any combination thereof. As an example, the method 1400 of FIG. 14 can be performed by one or more processors or execution units that execute instructions, as further described with reference to FIG. 16.

An electronic device (e.g., an integrated circuit, a semiconductor device, or a passive-on-glass device) including an electronic device structure formed by the method 1400 may include conductive structures that have a lower level of contamination or damage than conductive structures fabricated using other processes. Conductive structures having a lower contamination level or damage level may conduct signals (e.g., signals between integrated circuit components) more efficiently (e.g., more quickly and using less power). Further, fabrication of the conductive structures may facilitate fabricating a layer that has a non-uniform dielectric constant. An electronic device that includes a layer that has a non-uniform dielectric constant may decrease a capacitance (e.g., cross-coupling capacitance) associated with conductive structures (e.g., interconnect wires) that are close together. Additionally, fabrication of the conductive structures as described may facilitate fabricating a pristine dielectric layer. A pristine dielectric layer may have a lower dielectric constant, as compared to a dielectric layer that has been subjected to etch processing. A lower dielectric constant may reduce a capacitance associated with conductive structures interspersed with the pristine dielectric layer. Reducing the capacitance associated with the conductive structures may reduce delay (e.g., resistive-capacitive (RC) delay) and thereby improve performance and power characteristics associated with the conductive structures.

Figure 15:
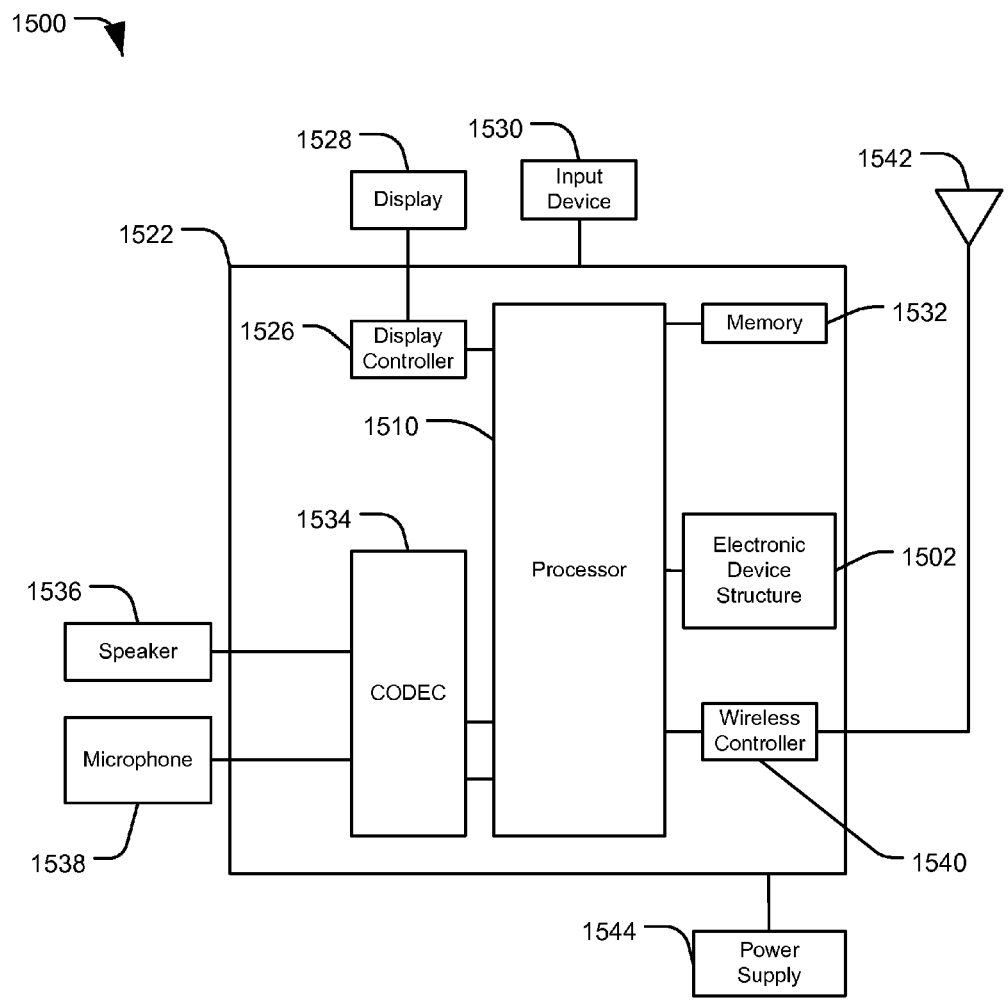
FIG. 15 is a block diagram that illustrates a communication device including an electronic device structure.

Referring to FIG. 15, a block diagram depicts a particular illustrative embodiment of a mobile device 1500 that includes an electronic device structure 1502. The mobile device 1500, or components thereof, may include, implement, or be included within a device such as a communications device, a mobile phone, a cellular phone, a computer, a portable computer, a tablet, an entertainment unit, a navigation device, a personal digital assistant (PDA), a mobile location data unit, a desktop computer, a monitor, a computer monitor, a television, a tuner, a radio, a satellite radio, a music player, a digital music player, a portable music player, a video player, a digital video player, a digital video disc (DVD) player, or a portable digital video player. Alternatively, the electronic device structure 1502 may be included within a fixed device such as an access point, a set top box, or a fixed location data unit.

The mobile device 1500 may include a processor 1510, such as a digital signal processor (DSP). The processor 1510 may include the electronic device structure 1502 or may be distinct from the electronic device structure 1502. In a particular embodiment, another component of the mobile device 1500 may include the electronic device structure 1502. The electronic device structure 1502 may correspond to a device or a component of a device (e.g., one or more interconnect wires) formed using one or more of the procedures described with reference to FIGS. 1-14. For example, low level of material contamination or structural damage low-k dielectric may also be used for transistor local interconnect or contact structure. The processor 1510 may be coupled to a memory 1532 (e.g., a non-transitory computer-readable medium).

FIG. 15 also shows a display controller 1526 that is coupled to the processor 1510 and to a display 1528. A coder/decoder (CODEC) 1534 can also be coupled to the processor 1510. A speaker 1536 and a microphone 1538 can be coupled to the CODEC 1534. A wireless controller 1540 can be coupled to the processor 1510 and can be further coupled to an antenna 1542.

In a particular embodiment, the processor 1510, the display controller 1526, the memory 1532, the CODEC 1534, the wireless controller 1540, and the electronic device structure 1502 are included in a system-in-package or system-on-chip device 1522. An input device 1530 and a power supply 1544 may be coupled to the system-on-chip device 1522. Moreover, in a particular embodiment, and as illustrated in FIG. 15, the display 1528, the input device 1530, the speaker 1536, the microphone 1538, the antenna 1542, and the power supply 1544 are external to the system-on-chip device 1522. However, each of the display 1528, the input device 1530, the speaker 1536, the microphone 1538, the antenna 1542, and the power supply 1544 can be coupled to a component of the system-on-chip device 1522, such as an interface or a controller. The electronic device structure 1502 may be included in the system-on-chip device 1522, as shown in FIG. 15, or may be included in one or more separate components.

Figure 16:
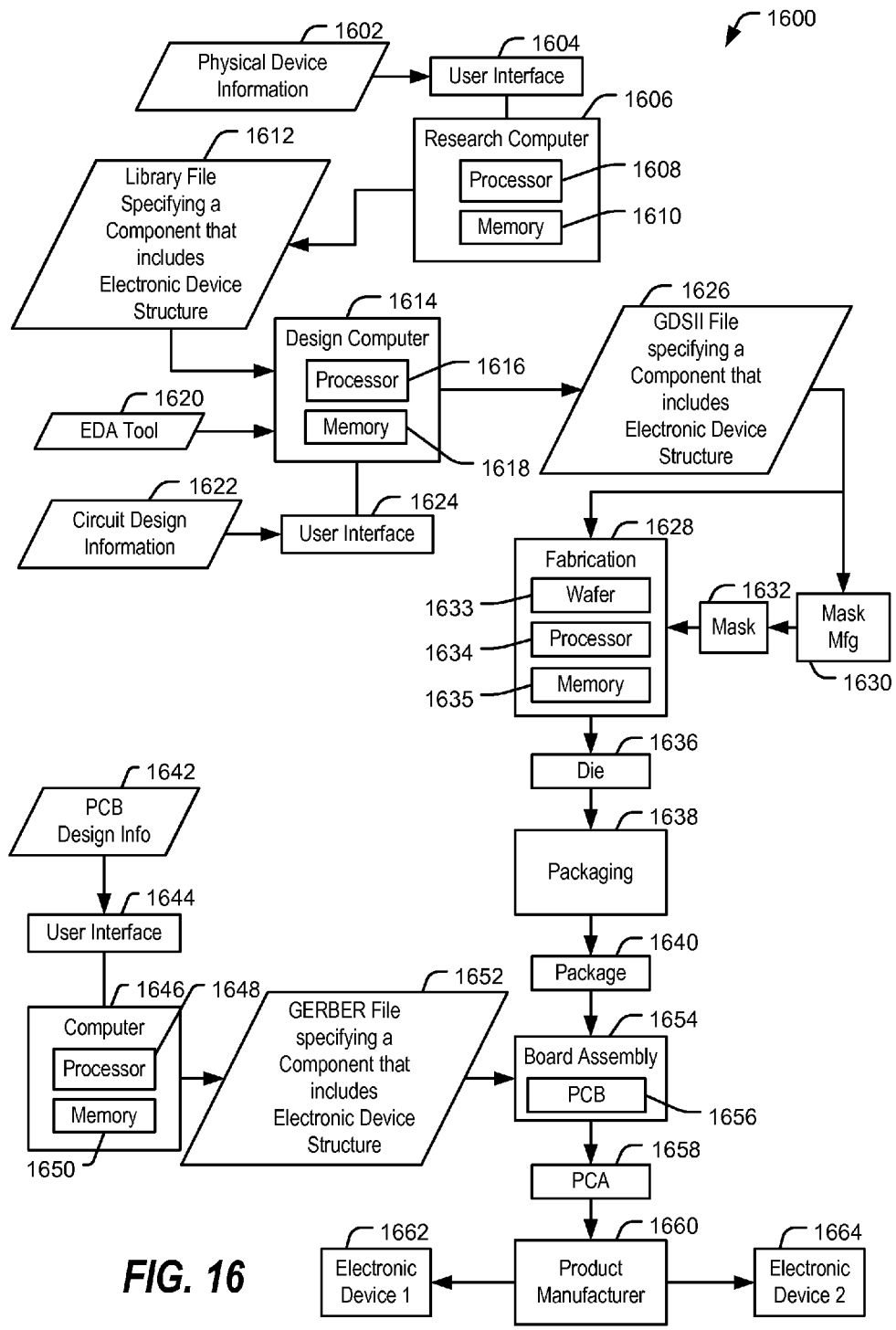
FIG. 16 is a data flow diagram that illustrates a particular illustrative embodiment of a manufacturing process to manufacture electronic devices that include an electronic device structure.

The foregoing disclosed devices and functionalities may be designed and configured into computer files (e.g., RTL, GDSII, GERBER, etc.) stored on computer-readable media. Some or all such files may be provided to fabrication handlers to fabricate devices based on such files. Resulting products include wafers that are then cut into dies and packaged into chips. The chips are then employed in the described devices. FIG. 16 depicts a particular illustrative embodiment of an electronic device manufacturing process 1600.

Physical device information 1602 is received at the manufacturing process 1600, such as at a research computer 1606. The physical device information 1602 may include design information representing at least one physical property of an electronic device, such as a physical property of a device formed using one or more of the procedures described with reference to FIGS. 1-14. For example, the physical device information 1602 may include physical parameters, material characteristics, and structure information that is entered via a user interface 1604 coupled to the research computer 1606. The research computer 1606 includes a processor 1608, such as one or more processing cores, coupled to a computer-readable medium such as a memory 1610. The memory 1610 may store computer-readable instructions that are executable to cause the processor 1608 to transform the physical device information 1602 to comply with a file format and to generate a library file 1612.

In a particular embodiment, the library file 1612 includes at least one data file including the transformed design information. For example, the library file 1612 may include a library of electronic devices (e.g., semiconductor devices), including a component having an electronic device structure formed using one or more of the procedures described with reference to FIGS. 1-14, provided for use with an electronic design automation (EDA) tool 1620.

The library file 1612 may be used in conjunction with the EDA tool 1620 at a design computer 1614 including a processor 1616, such as one or more processing cores, coupled to a memory 1618. The EDA tool 1620 may be stored as processor executable instructions at the memory 1618 to enable a user of the design computer 1614 to design a circuit including an electronic device structure formed using one or more of the procedures described with reference to FIGS. 1-14, using the library file 1612. For example, a user of the design computer 1614 may enter circuit design information 1622 via a user interface 1624 coupled to the design computer 1614. The circuit design information 1622 may include design information representing at least one physical property of an electronic device, such as an electronic device structure formed using one or more of the procedures described with reference to FIGS. 1-14. To illustrate, the circuit design property may include identification of particular circuits and relationships to other elements in a circuit design, positioning information, feature size information, interconnection information, or other information representing a physical property of an electronic device.

The design computer 1614 may be configured to transform the design information, including the circuit design information 1622, to comply with a file format. To illustrate, the file formation may include a database binary file format representing planar geometric shapes, text labels, and other information about a circuit layout in a hierarchical format, such as a Graphic Data System (GDSII) file format. The design computer 1614 may be configured to generate a data file including the transformed design information, such as a GDSII file 1626 that includes information describing a component having an electronic device structure formed using one or more of the procedures described with reference to FIGS. 1-14, in addition to other circuits or information. To illustrate, the data file may include information corresponding to a system-on-chip (SOC) or a chip interposer component that that includes an electronic device structure formed using one or more of the procedures described with reference to FIGS. 1-14, and that also includes additional electronic circuits and components within the SOC.

The GDSII file 1626 may be received at a fabrication process 1628 to manufacture an electronic device structure formed using one or more of the procedures described with reference to FIGS. 1-14 according to transformed information in the GDSII file 1626. For example, a device manufacture process may include providing the GDSII file 1626 to a mask manufacturer 1630 to create one or more masks, such as masks to be used with photolithography processing, illustrated in FIG. 16 as a representative mask 1632. The mask 1632 may be used during the fabrication process to generate one or more wafers 1633, which may be tested and separated into dies, such as a representative die 1636. The die 1636 includes a circuit including an electronic device structure formed using one or more of the procedures described with reference to FIGS. 1-14.

In a particular embodiment, the fabrication process 1628 may be initiated by or controlled by a processor 1634. The processor 1634 may access a memory 1635 that includes executable instructions such as computer-readable instructions or processor-readable instructions. The executable instructions may include one or more instructions that are executable by a computer, such as the processor 1634.

The fabrication process 1628 may be implemented by a fabrication system that is fully automated or partially automated. For example, the fabrication process 1628 may be automated and may perform processing steps according to a schedule. The fabrication system may include fabrication equipment (e.g., processing tools) to perform one or more operations to form an electronic device. For example, the fabrication equipment may be configured to perform one or more of the processes described with reference to FIGS. 1-14 using integrated circuit manufacturing processes (e.g., wet etching, chemical vapor etching, dry etching, deposition, chemical vapor deposition, planarization, lithography, in-situ baking, or a combination thereof).

The fabrication system may have a distributed architecture (e.g., a hierarchy). For example, the fabrication system may include one or more processors, such as the processor 1634, one or more memories, such as the memory 1635, and/or controllers that are distributed according to the distributed architecture. The distributed architecture may include a high-level processor that controls or initiates operations of one or more low-level systems. For example, a high-level portion of the fabrication process 1628 may include one or more processors, such as the processor 1634, and the low-level systems may each include or may be controlled by one or more corresponding controllers. A particular controller of a particular low-level system may receive one or more instructions (e.g., commands) from a high-level system, may issue sub-commands to subordinate modules or process tools, and may communicate status data back to the high-level system. Each of the one or more low-level systems may be associated with one or more corresponding pieces of fabrication equipment (e.g., processing tools). In a particular embodiment, the fabrication system may include multiple processors that are distributed in the fabrication system. For example, a controller of a low-level system component of the fabrication system may include a processor, such as the processor 1634.

Alternatively, the processor 1634 may be a part of a high-level system, subsystem, or component of the fabrication system. In another embodiment, the processor 1634 includes distributed processing at various levels and components of a fabrication system.

Thus, the memory 1635 may include processor-executable instructions that, when executed by the processor 1634, cause the processor 1634 to initiate or control formation of a substrate (e.g., corresponding to the substrate described with reference to FIG. 1), multiple conductive structures deposited above the substrate (e.g., corresponding to the one or more conductive structures 108 of FIGS. 1-7, or the one or more conductive structures 108 of FIGS. 8-13), and/or a low-k layer interspersed between the multiple conductive structures (e.g., corresponding to the third low-k layer 1202 of FIGS. 12 and 13).

The die 1636 may be provided to a packaging process 1638 where the die 1636 is incorporated into a representative package 1640. For example, the package 1640 may include the single die 1636 or multiple dies, such as a system-in-package (SiP) arrangement. The package 1640 may be configured to conform to one or more standards or specifications, such as Joint Electron Device Engineering Council (JEDEC) standards.

Information regarding the package 1640 may be distributed to various product designers, such as via a component library stored at a computer 1646. The computer 1646 may include a processor 1648, such as one or more processing cores, coupled to a memory 1650. A printed circuit board (PCB) tool may be stored as processor executable instructions at the memory 1650 to process PCB design information 1642 received from a user of the computer 1646 via a user interface 1644. The PCB design information 1642 may include physical positioning information of a packaged electronic device on a circuit board, the packaged electronic device corresponding to the package 1640 including an electronic device structure formed using one or more of the procedures described with reference to FIGS. 1-14.

The computer 1646 may be configured to transform the PCB design information 1642 to generate a data file, such as a GERBER file 1652 with data that includes physical positioning information of a packaged electronic device on a circuit board, as well as layout of electrical connections such as traces and vias, where the packaged electronic device corresponds to the package 1640 including a component having an electronic device structure formed using one or more of the procedures described with reference to FIGS. 1-14. In other embodiments, the data file generated by the transformed PCB design information may have a format other than a GERBER format.

The GERBER file 1652 may be received at a board assembly process 1654 and used to create PCBs, such as a representative PCB 1656, manufactured in accordance with the design information stored within the GERBER file 1652. For example, the GERBER file 1652 may be uploaded to one or more machines to perform various steps of a PCB production process. The PCB 1656 may be populated with electronic components including the package 1640 to form a representative printed circuit assembly (PCA) 1658.

The PCA 1658 may be received at a product manufacturer 1660 and integrated into one or more electronic devices, such as a first representative electronic device 1662 and a second representative electronic device 1664. As an illustrative, non-limiting example, the first representative electronic device 1662, the second representative electronic device 1664, or both, may be selected from a set top box, a music player, a video player, an entertainment unit, a navigation device, a communications device, a personal digital assistant (PDA), a fixed location data unit, and a computer, into which an electronic device structure formed using one or more of the procedures described with reference to FIGS. 1-14, is integrated. As another illustrative, non-limiting example, one or more of the electronic devices 1662 and 1664 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 16 illustrates remote units according to teachings of the disclosure, the disclosure is not limited to these illustrated units. Embodiments of the disclosure may be suitably employed in any device which includes active integrated circuitry including memory and on-chip circuitry.

A device (or component) having an electronic device structure formed using one or more of the procedures described with reference to FIGS. 1-14, may be fabricated, processed, and incorporated into an electronic device, as described in the illustrative manufacturing process 1600. One or more aspects of the embodiments disclosed with respect to FIGS. 1-14 may be included at various processing stages, such as within the library file 1612, the GDSII file 1626, and the GERBER file 1652, as well as stored at the memory 1610 of the research computer 1606, the memory 1618 of the design computer 1614, the memory 1650 of the computer 1646, the memory of one or more other computers or processors (not shown) used at the various stages, such as at the board assembly process 1654, and also incorporated into one or more other physical embodiments such as the mask 1632, the die 1636, the package 1640, the PCA 1658, other products such as prototype circuits or devices (not shown), or any combination thereof. Although various representative stages are depicted with reference to FIGS. 1-13, in other embodiments fewer stages may be used or additional stages may be included. Similarly, the process 1600 of FIG. 16 may be performed by a single entity or by one or more entities performing various stages of the manufacturing process 1600.

In a particular embodiment, a computer-readable storage device stores instructions that, when executed by a processor, cause the processor to perform operations. The operations include forming an electronic device structure including a substrate, an oxide layer, and a first low-k layer. The operations also include forming multiple openings in the electronic device structure by patterning the oxide layer and filling the openings with a conductive material to form multiple conductive structures within the openings. The conductive structures contact the first low-k layer. The operations further include, after forming the conductive structures, removing the oxide layer using the first low-k layer as an etch stop layer. Removing the oxide layer includes performing a chemical vapor etch process with respect to the oxide layer to form an etch byproduct and removing the etch byproduct. The operations also include forming a second low-k layer after removing the oxide layer. The second low-k layer is formed using a deposition process that causes the second low-k layer to define one or more cavities. Each of the one or more cavities is defined between a first conductive structure of the conductive structures and a second conductive structure of the conductive structures. The first conductive structure is adjacent to the second conductive structure. A spacing between the first conductive structure and the second conductive structure is smaller than a threshold distance.

The computer-readable storage device may correspond to the memory 1610, the memory 1618, or the memory 1650 of FIG. 16. The processor may correspond to the processor 1608, the processor 1616, or the processor 1648 of FIG. 16. The first low-k layer may correspond to the first low-k layer 104 of FIGS. 1-13. The oxide layer may correspond to the oxide layer 102 of FIGS. 1-10. The openings may correspond to the one or more openings 702 of FIG. 7. The conductive structures may correspond to the one or more conductive structures 108 of FIGS. 1-7 or the one or more conductive structures 108 of FIGS. 8-13. The etch byproduct may correspond to the etch byproduct 902 of FIG. 9. The second low-k layer may correspond to the third low-k layer 1202 of FIGS. 12-13. The one or more cavities may correspond to the cavity 1204 of FIGS. 12-13.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in memory, such as random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM). The memory may include any form of non-transient storage medium known in the art. An exemplary storage medium (e.g., memory) is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method comprising:
    forming an electronic device structure including a substrate, an oxide layer, and a first low-k layer, wherein the oxide layer comprises a silicon oxide;
    forming multiple openings in the electronic device structure by patterning the oxide layer;
    filling the multiple openings with a conductive material to form multiple conductive structures within the multiple openings, wherein the multiple conductive structures contact the first low-k layer;
    after forming the multiple conductive structures, removing the oxide layer using the first low-k layer as an etch stop layer, wherein removing the oxide layer comprises:
        performing a chemical vapor etch process with respect to the oxide layer to form an etch byproduct; and
        removing the etch byproduct; and
    after removing the oxide layer, forming a second low-k layer, wherein the second low-k layer is formed using a deposition process that causes the second low-k layer to define one or more cavities,
        wherein each cavity of the one or more cavities is defined between a first conductive structure of the multiple conductive structures and a second conductive structure of the multiple conductive structures,
        wherein the first conductive structure is adjacent to the second conductive structure,
        wherein a spacing between the first conductive structure and the second conductive structure is smaller than a threshold distance, and
        wherein the threshold distance corresponds to characteristics of the deposition process, characteristics of deposition tools associated with the deposition process, or both.

2. The method of claim 1, wherein forming the multiple openings further comprises etching the first low-k layer, and wherein removing the etch byproduct comprises heating the etch byproduct.

3. The method of claim 1, wherein the oxide layer is etched using a damascene etch process, and wherein the multiple conductive structures are formed using a damascene deposition process.

4. The method of claim 1, wherein an etchant used in the chemical vapor etch process reacts with a portion of the oxide layer to form the etch byproduct, and wherein the chemical vapor etch process and removing the etch byproduct are performed iteratively until the first low-k layer is exposed.

5. The method of claim 1, wherein an etchant used in the chemical vapor etch process reacts with all of the oxide layer to form the etch byproduct.

6. The method of claim 1, wherein the chemical vapor etch process comprises a self-limiting chemical vapor etch process.

7. The method of claim 1, wherein a chemical vapor of the chemical vapor etch process comprises ammonium ($NH_4$) and hydrogen fluoride (HF), ammonium and nitrogen trifluoride ($NF_3$), or a combination thereof.

8. The method of claim 1, wherein a chemical vapor of the chemical vapor etch process is nonreactive with the multiple conductive structures, and wherein the oxide layer has a higher dielectric constant than the first low-k layer.

9. The method of claim 1, wherein the silicon oxide comprises silicon dioxide ($SiO_2$), wherein sidewalls of the multiple conductive structures are substantially straight and wherein the conductive structures comprise copper, tungsten, silver, gold, an alloy of copper, tungsten, silver, or gold, or a combination thereof.

10. The method of claim 1, wherein, after the oxide layer is removed, the multiple conductive structures are not rounded due to previous etch processing.

11. The method of claim 1, wherein the multiple conductive structures are included in an integrated circuit device or a semiconductor device.

12. The method of claim 1, wherein forming the electronic device structure comprises:
forming the first low-k layer above the substrate; and
forming the oxide layer above the first low-k layer.

13. The method of claim 1, wherein a dielectric constant of the second low-k layer is non-uniform based on a distance between adjacent conductive structures of the multiple conductive structures.

14. The method of claim 1, wherein no liner is formed between the multiple conductive structures and the second low-k layer.

15. The method of claim 1, wherein a first dielectric constant associated with a first portion of the second low-k layer is less than a second dielectric constant associated with a second portion of the second low-k layer, wherein the first portion includes at least one of the one or more cavities, and wherein the second portion includes none of the one or more cavities.

16. The method of claim 1, wherein a first effective capacitance associated with a first pair of the multiple conductive structures is less than a second effective capacitance associated with a second pair of the multiple conductive structures, wherein the first pair of the multiple conductive structures has at least one of the one or more cavities therebetween, and wherein the second pair of the multiple conductive structures has none of the one or more cavities therebetween.

17. The method of claim 1, wherein the deposition process is selected based on a spacing between at least one pair of adjacent conductive structures of the multiple conductive structures, and wherein the deposition process comprises a chemical vapor deposition process.

18. The method of claim 1, wherein at least one cavity of the one or more cavities comprises an air gap.

19. The method of claim 1, wherein the second low-k layer does not define a cavity between adjacent conductive structures of the multiple conductive structures that have a spacing greater than or equal to the threshold distance.

20. The method of claim 1, wherein the threshold distance is 30 nanometers, and wherein at least one cavity of the one or more cavities is defined at least in part by the first low-k layer.

21. The method of claim 1, wherein the second low-k layer is interspersed with at least a subset of the multiple conductive structures, wherein the multiple conductive structures are not subjected to etch processing that uses an etchant that is reactive with the multiple conductive structures, wherein the second low-k layer is not subjected to etch processing that uses an etchant that is reactive with the second low-k layer, wherein the second low-k layer is formed above the multiple conductive structures, and wherein the second low-k layer comprises a pristine dielectric layer.

22. The method of claim 21, further comprising removing the second low-k layer from above the multiple conductive structures using a chemical-mechanical planarization process.

23. The method of claim 1, wherein forming the electronic device structure, forming the multiple openings, forming the multiple conductive structures, removing the oxide layer, and forming the second low-k layer are initiated by a processor integrated into an electronic device.

24. The method of claim 1, further comprising forming an electronic device, wherein the electronic device is formed by forming the electronic device structure, forming the multiple openings, filling the multiple openings, removing the oxide layer, and forming the second low-k layer.

25. The method of claim 1, wherein the threshold distance is greater than 20 nanometers.

26. The method of claim 1, wherein the threshold distance is less than or equal to 45 nanometers.

27. A method comprising:
forming an electronic device structure including a substrate, an oxide layer, and a first low-k layer, wherein the oxide layer comprises a silicon oxide;
forming multiple openings in the electronic device structure by patterning the oxide layer;
filling the multiple openings with a conductive material to form multiple conductive structures within the multiple openings, wherein the multiple conductive structures contact the first low-k layer;
after forming the multiple conductive structures, removing the oxide layer using the first low-k layer as an etch stop layer, wherein removing the oxide layer comprises:
performing a chemical vapor etch process with respect to the oxide layer to form an etch byproduct; and
removing the etch byproduct; and
after removing the oxide layer, forming a second low-k layer, wherein the second low-k layer is formed using a deposition process that causes the second low-k layer to define one or more cavities,
wherein each cavity of the one or more cavities is defined between a first conductive structure of the multiple conductive structures and a second conductive structure of the multiple conductive structures,
wherein the first conductive structure is adjacent to the second conductive structure,
wherein a spacing between the first conductive structure and the second conductive structure is smaller than a threshold distance,
wherein the threshold distance corresponds to characteristics of the deposition process, characteristics of deposition tools associated with the deposition process, or both, and wherein forming the electronic device structure, forming the multiple openings, forming the multiple conductive structures, removing the oxide layer, and forming the second low-k layer are initiated by a processor integrated into a device, the device including a computer-readable storage device storing instructions executed by the processor to cause the processor to form the electronic device structure, to form the multiple openings, to fill the multiple openings, to remove the oxide layer, and to form the second low-k layer.

28. The method of claim 27, wherein the threshold distance is approximately 30 nanometers.

* * * * *